United States Patent [19]
Ballantyne et al.

[11] Patent Number: 5,764,681
[45] Date of Patent: Jun. 9, 1998

[54] DIRECTIONAL CONTROL METHOD AND APPARATUS FOR RING LASER

[75] Inventors: Joseph M. Ballantyne, Ithaca, N.Y.; Stanley T. Lau, Sunnyvale; James J. Liang, Mountain View, both of Calif.

[73] Assignee: Cornell Research Foundation, Inc., Ithaca, N.Y.

[21] Appl. No.: 741,782

[22] Filed: Nov. 1, 1996

[51] Int. Cl.$^6$ .................................................. H01S 3/083
[52] U.S. Cl. ..................... 372/94; 372/92; 372/93; 372/98; 372/99
[58] Field of Search ...................... 372/8, 11, 21, 372/69, 70, 92, 98, 93, 94, 99

[56] References Cited

U.S. PATENT DOCUMENTS

| | | | |
|---|---|---|---|
| 3,414,839 | 12/1968 | Bridges et al. | 372/94 X |
| 4,194,168 | 3/1980 | Jarrett et al. | 372/94 X |
| 4,405,236 | 9/1983 | Mitsuhashi et al. | 372/94 X |
| 4,986,661 | 1/1991 | Vick | 372/94 X |
| 5,007,065 | 4/1991 | Trutna, Jr. | 372/94 |
| 5,177,764 | 1/1993 | Nilsson | 372/94 |
| 5,276,701 | 1/1994 | Shirasaki | 372/94 |

*Primary Examiner*—Brian Healy
*Attorney, Agent, or Firm*—Jones, Tullar & Cooper, P.C.

[57] ABSTRACT

An asymmetric feedback structure in a ring laser produces essentially unidirectional lasing. The structure can be dynamic to permit directional control, or can be passive to provide unidirectional lasing in a predetermined direction. Dynamic control is obtained by a dielectric stack in the laser cavity, the stack including multiple layers having complex impedances for reflecting incident light. The amount and direction of reflection is controlled by varying the refractive indices or the absorption coefficients of the materials in the layers to produce cross-coupling for one direction which is different from the other direction. Passive control is obtained by introducing an asymmetry into the propagation path of the laser. This may be in the form of an optical diode structure or a tapered waveguide structure to produce asymmetric cross-coupling of counter-propagating modes of the laser light.

38 Claims, 4 Drawing Sheets

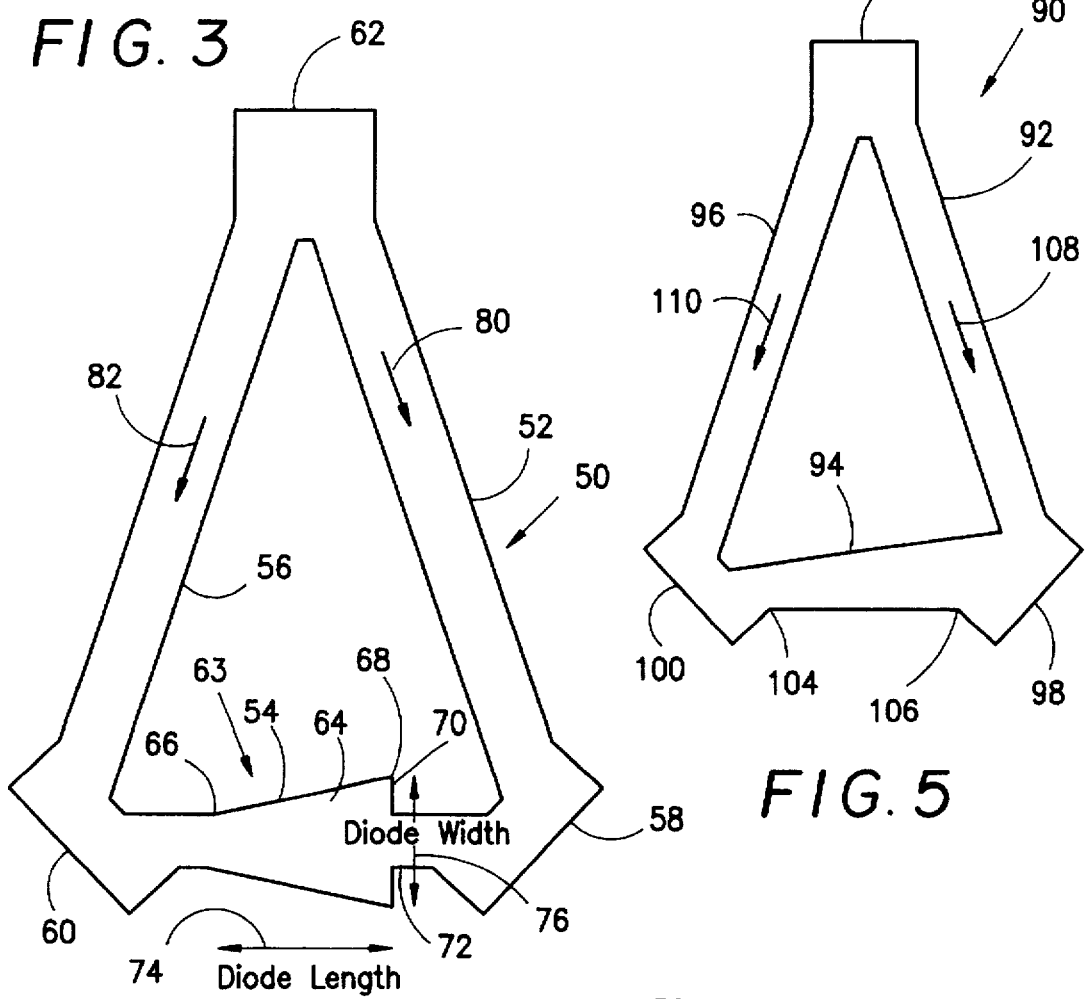
FIG. 3
FIG. 5
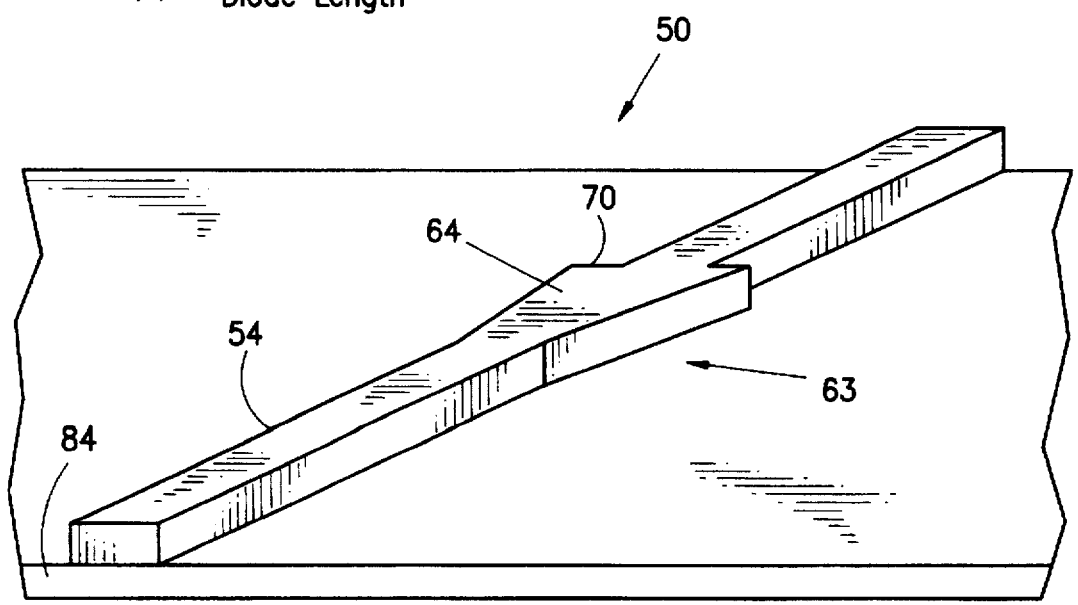
FIG. 4

DIRECTIONAL CONTROL METHOD AND APPARATUS FOR RING LASER

This invention was made with Government support under Contract No. F30602-92-C-0082 awarded by ARPA. The Government has certain rights in the invention.

This application claims the benefit of U.S. Provisional Application No. 60/007204, filed Nov. 3, 1995, the disclosure of which is hereby incorporated herein by reference.

BACKGROUND OF THE INVENTION

The present invention relates, in general, to a method and apparatus for providing a unidirectional ring laser, and more particularly it is directed to the provision of asymmetric coupling of circulating waves in a ring laser to provide a stable unidirectional output.

Unidirectional ring cavity lasers possess benefits that a Fabry-Perot cavity does not provide; for example, a unidirectional ring laser will produce lasing action with higher spectral purity than can be obtained with a bidirectional ring. As a consequence of this and of their lower spatial and spectral hole burning, unidirectional rings have lower noise than bidirectional rings. Furthermore, because a unidirectional triangular ring laser has only one output beam, and because it is difficult to combine the two output beams of a bidirectional ring into a single output waveguide, a unidirectional ring shows greater power output (for the same pump input) and greater power conversion (from pump input to beam output) than does a bidirectional ring.

It is difficult to exploit the beneficial characteristics of ring lasers, however, for to do so one must ensure in a deterministic fashion that the laser is indeed unidirectional. Additionally, one must be able to control the direction of lasing. This has been accomplished in the past by a variety of methods, including non-planar ring geometries and the use of an accousto-optic Q-switch. However, the most common, and effective, method requires the use of an expensive intra-cavity optical isolator. This device usually has a magnetic medium and utilizes the Faraday effect to introduce a non-reciprocal, or direction dependent, loss which produces in the ring laser a preferential direction of lasing. Although the isolator imposes unidirectional operation, it requires a magnetic field which adds to the size and cost of the isolator and does not allow the lasing direction to be conveniently and rapidly switched. Although such an isolator is used for large cavity gas, dye and solid state lasers, it cannot be used to control the new generation of integrated ring lasers currently being developed.

Advances in current monolithic integration technology have allowed lasers of much more complicated geometry to be fabricated, including ring lasers with a variety of cavity configurations. These developments expand the prospective applications for integrated semiconductor lasers, and add the attractiveness of smaller size, greater manufacturability and reduced cost. However, the nature of such integrated monolithic lasers does not permit introduction of a conventional optical isolator into the cavity. Therefore, a new technique for controlling ring lasers is needed to provide unidirectional operation in lasers utilizing any type of gain medium in any wavelength regime in the electromagnetic spectrum. Preferably, a technique which can be employed with integrated semiconductor ring lasers is needed, although the techniques should be applicable to other lasers. Another desirable feature for such devices would be the provision of a structure which would permit easy and convenient switching of the lasing direction of the ring laser.

SUMMARY OF THE INVENTION

Briefly, the present invention is directed to a method and to apparatus for producing asymmetric coupling of laser beams propagating within a ring laser to produce a unidirectional output.

It is well known that unwanted retroreflection can have adverse effects on the operation of both Fabry-Perot and ring cavity lasers. These reflections are usually caused by external optics which feed back into the laser cavity, producing changes in the output power, spectral character, and line width of the laser. There can also be intra-cavity reflections caused by scattering, surface roughness of mirrors, refractive index differences between internal optical components and the laser cavity, or, in the case of a diode laser, scattering centers within the semiconductor material. Intra-cavity reflections serve to couple the two possible directions of propagation. This is desirable for a Fabry-Perot laser, and in fact is the basis for the development of the DFB and DBR lasers, but is not desirable for a unidirectional ring laser, since this would encourage bidirectional operation. Because of this fact, back reflections have always been minimized, even when an optical isolator is employed. However, in a ring cavity with unequal back reflections, the reflectivity difference is translated into a difference in the powers of the oppositely circulating waves, and hence a difference in the output powers of the two directions of the ring laser. This asymmetric coupling is exploited to control the direction of lasing of a ring laser, in accordance with the present invention.

The light beams propagating in a ring laser are very sensitive to differences in the back reflectivity at any of the components of the cavity, and, depending on the actual difference, the relative ratio of the two output beams from a bidirectional laser can be very large. The direction of lasing can be controlled by adjusting the relative back reflectivities so that one or the other direction contains the dominant power. Although the theory of operation of such devices does not predict the complete extinction of one of the beams, but only indicates that the power of one beam can be made much larger than that of the other, nevertheless an essentially unidirectional mode of operation is achieved.

There are a variety of possible ways to create an asymmetric coupling of the bidirectional beams propagating in a ring laser. These include the use of a crossover waveguide, asymmetric saturable absorber regions in the waveguide, asymmetric reflectors, and asymmetric forward couplers. The present invention will be described in terms of an asymmetric reflector; i.e., a region in a ring laser which produces different reflection coefficients depending on the direction of incidence of propagating light, and in terms of an asymmetric forward coupler, i.e., a region in a ring laser which produces unequal losses at a mirror or at the junction of two waveguide sections. One example of an asymmetric reflector provides a graded index profile for one direction of propagation, and an abrupt profile for the other and which may be referred to as an asymmetric index profile structure. Another example of an asymmetric reflector which is usable in a low-order waveguide which supports only a few modes is the provision of a physical asymmetric transition region in an optical waveguide, such as a transition region which is gradual on one side and abrupt on the other.

A physically asymmetric transition region may be provided in a ring laser by fabricating such a laser with a tapering waveguide section wherein the wave guide widens very gradually over a given length and which then abruptly narrows to its original width. Alternatively, the waveguide could taper in more than one dimension; for example, it could taper in both width and thickness, although normally it would taper in only one dimension. Such a structure provides preferential cross coupling of the light travelling in one direction as opposed to light travelling in the opposite direction so that the structure acts like an optical diode. Another physically asymmetric transition may be provided by a structure having a gradual taper along a substantial length of a section between a pair of reflecting mirrors in the ring laser. Such a structure provides a waveguide dimension at a laser reflecting mirror which is greater than the mirror dimension, so that some light misses the mirror and propagates out of the laser cavity. This results in forward coupling which favors high-loss direction over the other.

Neither an asymmetric index profile nor an asymmetric physical transition allows the direction of lasing to be actively changed, since these are permanent structural features in the current embodiment, although a microelectromechanical structure (MEMS) might accomplish this function. Accordingly, a further feature of the invention is the provision of a dynamic asymmetric coupler which can be actively changed. Such a changeable structure can be obtained through the use of a reflector stack having an asymmetric index profile in the path of a ring laser, wherein the stack includes material which has a complex impedance which may be changed by an applied force, such as an electric field or current. The imaginary part of the impedance is due to loss or gain. Such a material is an active material which can be controllably changed, or modified, to vary the direction of lasing.

The dynamic asymmetric reflector stack may be a layered structure interposed in one leg of a ring laser, wherein the reflector maximizes the differences in the reflectivities at opposite ends of the stack while at the same maximizing the transmission of light in one direction. This difference in reflectivity produces the required cross coupling. Such a reflector can be controlled by adjusting either the refractive indices of the materials or by changing the gain or loss in each section. For example, control of the reflectivity difference may be achieved dynamically by the use of the electro-optic effect, whereby the refractive indices of the layers can be adjusted by the application of an electric field, or by any effect which varies the optical constants of a material, such as stress, magnetic field, electric current, temperature, etc. Changes in optical constants may be proportional to the applied effect, so that the reflectivity difference can be controlled.

Dynamic control can be obtained in diode lasers by providing multiple contacts on the laser. These contacts can be placed close together to define sections along the diode, and the loss or gain of each section can be changed by varying the current to that section. By changing the current to the respective sections, the direction of lasing can be changed.

BRIEF DESCRIPTION OF THE DRAWINGS

The foregoing, and additional objects, features and advantages of the present invention will be apparent to those of skill in the art from the following detailed description of preferred embodiments thereof, taking in conjunction with the accompanying drawings, in which:

FIG. 3 is a top view of a ring laser incorporating an optical diode asymmetric reflector;

FIG. 4 is a perspective view of a ridge waveguide incorporating an optical diode asymmetric reflector;

FIG. 5 is a top view of a ring laser incorporating a tapered waveguide turning mirror combination for asymmetric forward coupling;

DESCRIPTION OF PREFERRED EMBODIMENTS

Figure 1:
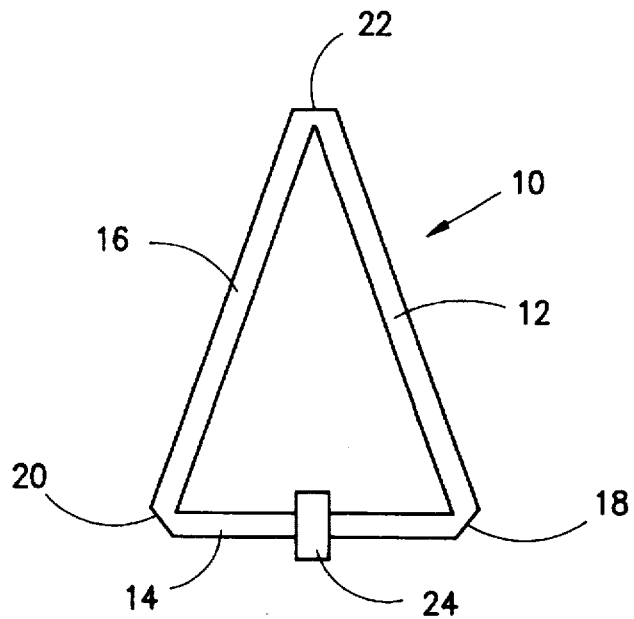
FIG. 1 is a diagrammatic illustration of a triangular ring laser incorporating an asymmetric reflector.

Turning now to a more detailed description of the present invention, FIG. 1 illustrates a ring laser 10 which, for purposes of illustration, is triangular, although other ring geometries may be utilized. The laser 10 incorporates three legs, 12, 14 and 16 which intersect at angled mirrors, or facets, 18, 20 and 22 which direct light propagating in each of the legs to the next adjacent leg in both clockwise and counterclockwise directions. The legs 12, 14 and 16 are optical waveguides and the connecting facets may be fabricated utilizing conventional monolithic integration technology, in the manner illustrated, for example, in U.S. Pat. No. 4,924,476, the disclosure of which is hereby incorporated herein by reference.

Figure 2:
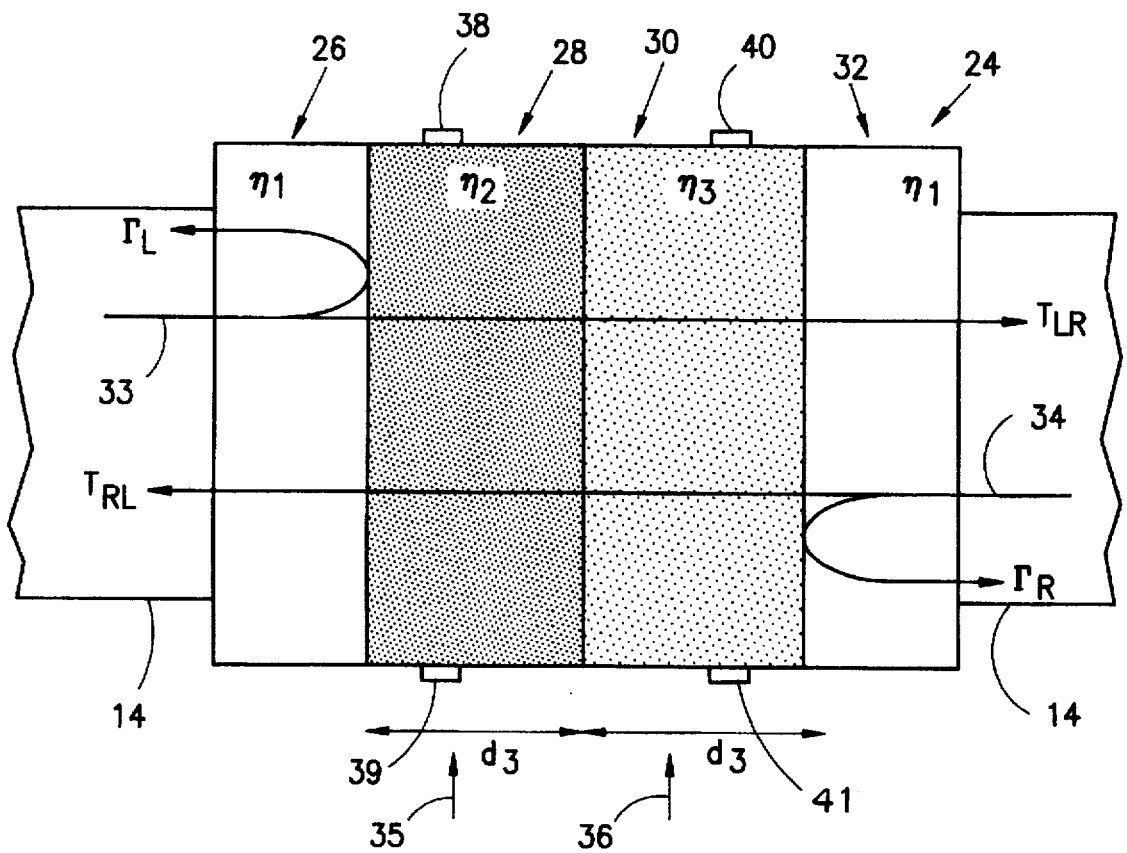
FIG. 2 is a diagrammatic illustration of an asymmetric reflector for the laser of FIG. 1.

In order to control the direction of propagation of light in the ring laser in order to provide a unidirectional output, an asymmetric coupler is provided in laser 10. This asymmetric coupling may take several forms, but in the embodiment of FIG. 1, an asymmetric reflector 24 is incorporated in one of the ring laser legs; for example, in leg 14. An example of this reflector is illustrated in FIG. 2, wherein the reflector consists of a four-layer dielectric stack including layers 26, 28, 30 and 32. The interfaces between the layers are assumed to be ideally smooth and abrupt, and the layers are homogenous, isotropic and linear. The first and last layers 26 and 32 are the same material, and the layers have respective impedances $n_1$, $n_2$, $n_3$ and $n_1$, respectively. All of these impedances may be complex, with complex propagation constants for a material "i" as follows:

$$\bar{k}_i = k_i - ja_i \qquad \text{Eq. 1}$$

where $k_i$ is for the phase accumulation and $a_i$ represents the gain coefficient which is positive for gain and negative for loss. The model illustrated in FIG. 2 provides a convenient method for representing the active reflector by a simple plane wave analysis. Although in reality the analysis may be more complex, as in the case of a waveguide mode, for example, the plane wave analysis can be used to illustrate the effects of the active layer materials on the reflectivity of the stack. In the following analysis, only normal incidence is considered, for an extension of the consideration to oblique incidence only complicates the algebra without providing further insight.

After developing the equivalent impedance transform for the material of layers $n_1$, $n_2$, $n_3$ having complex impedance and finite width (d), the reflection coefficients ($\Gamma$) for light 33 propagating in a counterclockwise direction and impinging on the stack 24 from the left ($\Gamma_L$) side (see FIG. 2) and for light 34 propagating in a clockwise direction and impinging on the stack 24 from the right side ($\Gamma_R$) are as follows:

$$\Gamma_L = \frac{\eta_2(\eta_3^2 - \eta_1^2)C_2S_3 + \eta_3(\eta_2^2 - \eta_1^2)S_2C_3 + \eta_1(\eta_2^2 - \eta_3^2)S_2S_3}{D} \quad \text{Eq. 2}$$

$$\Gamma_R = \frac{\eta_2(\eta_3^2 - \eta_1^2)C_2S_3 + \eta_3(\eta_2^2 - \eta_1^2)S_2C_3 - \eta_1(\eta_2^2 - \eta_3^2)S_2S_3}{D} \quad \text{Eq. 3}$$

$$D = \eta_3(\eta_2^2 - \eta_1^2)S_2C_3 + 2\eta_1\eta_2\eta_3C_2C_3 + \eta_1(\eta_2^2 - \eta_3^2)S_2S_3 + \eta_2(\eta_1^2 + \eta_3^2)C_2S_3 \quad \text{Eq. 4}$$

$$\eta_i = \frac{\omega\mu_i}{\alpha_i^2 + k_i^2}(k_i + j\alpha_i) \quad \text{Eq. 5}$$

$$C_i = \cosh((\alpha_i + jk_i)d_i) \quad \text{Eq. 6}$$
$$\quad = \cosh(\alpha_i d_i)\cos(k_i d_i) + j\sinh(\alpha_i d_i)\sin(k_i d_i)$$

$$S_i = \sinh((\alpha_i + jk_i)d_i) \quad \text{Eq. 7}$$
$$\quad = \sinh(\alpha_i d_i)\cos(k_i d_i) + j\cosh(\alpha_i d_i)\sin(k_i d_i)$$

where $d_i$ is the thickness of the layer i.

Although the expression for the denominator of $\Gamma_L$ and $\Gamma_R$ is given in equation (4), it is enough to know that it is the same for both coefficients. It is the functional difference of the reflection coefficients $\Gamma_L$ and $\Gamma_R$ that is important. Thus, the only difference between equations 2 and 3 is the 3rd term of each, and that is only a sign difference. However, the key to this design is the fact that $C_i$, $S_i$ and $\eta_i$ are all complex. Taking this into account, then, the sign difference of the third term is all that is needed to make $\Gamma_L \neq \Gamma_R$. Therefore, different fractions of the incident power $|\Gamma|^2$ are reflected, depending on the direction of the incident light, as illustrated in FIG. 2. This term also shows that $n_2$ must not be the same as $n_3$, or else the reflectivities will be the same, since this term goes to zero. This condition simply enforces the fact that there must be an asymmetry in the stack for an asymmetry to exist in the back reflectivities.

Another condition for asymmetric reflectivity is that at least one of the materials must have a complex impedance; that is, there must be a gain or loss somewhere within the stack. If all of the materials are lossless, then the first and second terms in the numerator will be purely imaginary and the third term will be purely real. For this case, then, $|\Gamma_L|=|\Gamma_R|$ and the power reflection coefficients are the same.

It is easy to verify that the transmission coefficient T for the stack is:

$$T_{LR} = T_{RL} = \frac{2\eta_1\eta_2\eta_3}{D} \quad \text{Eq. 8}$$

where $T_{LR}$ is the portion of beam 33 which passes through the stack and $T_{RL}$ is the portion of beam 34 which passes through stack 24, as illustrated in FIG. 2. This equation shows that the reciprocity of the stack is maintained, with the same power transmission $|T|^2$ in each direction, as expected.

The asymmetric reflector described above can be controlled by adjusting either the refractive indices of the materials, as by using for one layer an electro-optic material like $LiNbO_3$ or GaAs, or by changing the absorption coefficient of active materials such as a semiconductor like GaAs or related quantum well structures; i.e., by changing the gain or loss in one or more of the sections 26, 28, 30 or 32.

Although the illustrated example in FIG. 2 has only three different impedances, each of these may represent the equivalent impedance of a more complicated structure. For example, $n_2$ may actually be the equivalent impedance of a dielectric stack (such as alternating layer of $SiO_2$ and $T_iO_2$) used as a reflection coating. As another example, control of the reflectivity difference can be achieved dynamically by the use of the electro-optic effect, whereby the refractive indices of the layers can be adjusted by the application of electric fields. The change in refractive index in the layer is proportional to the applied field, so by using various field strengths, the reflectivity difference can be controlled. By using two sections of electro-optic material, such as the sections 28 and 30, relative index changes of the sections produced by changing the electric fields indicated at 35 and 36 provides a convenient way to dynamically select the direction of light propagation within the ring laser. The direction can also be changed by changing the sign of the active material from lossy to amplifying, or vice versa.

Controllable electric fields 35 and 36 may be applied across selected layers of the asymmetric reflector stack 24 by means of variable electric potentials applied across contacts 38, 39 and 40, 41 on the layers $n_2$ and $n_3$, respectively. For diode lasers, the layers can be replaced by individually contacted adjacent sections of the laser waveguide, and the gain of each section can then be changed by varying the current to that section. Thus, by simply changing the current to the respective sections, the lasing direction can be easily switched.

In FIG. 1 the asymmetric reflector stack 24 is illustrated as being located symmetrically within the laser cavity. However, due to phase and beam considerations, the location of the reflector stack within the cavity will influence the overall performance of the laser, and must be accounted for in the laser cavity design. To employ the asymmetric reflector stack of the present invention in a laser cavity, it is necessary to maximize the transmission T through the stack 24 while at the same time maximizing the difference in the reflectivities. This is necessary to reduce the losses in the laser cavity. These two goals may not be completely compatible, and some tradeoff between the laser threshold and the degree of unidirectionality may be required. However, an active medium with gain can be used to provide the desired complex impedance to enable the reflector to work.

Although a unidirectional laser with a dynamically changeable lasing direction is preferred, there are numerous applications where a stable single direction laser can be used. A passive structure with permanent features and no active elements is more suited to this goal, since the direction of lasing is predetermined. One technique for achieving a passive asymmetric coupler is to introduce a physical asymmetry into the propagation path of the laser cavity, as by varying the cavity geometry in the manner illustrated in FIGS. 3, 4 and 5. This asymmetric variation in geometry introduces a spatially asymmetric index profile along the waveguide. This is due to the fact that the effective refractive index of a guided mode depends upon the waveguide width, which varies asymmetrically with length. FIGS. 3 and 4 illustrate an "optical diode" structure wherein a ridge waveguide is gradually widened by an outward taper, and then is abruptly returned to its original width. With this geometry, the reflection, transmission, and/or scattering loss of an incident mode will depend on its direction of propagation through the structure, and thus an asymmetric cross-coupling of counter-propagating, or bidirectional, modes is provided. For the example shown in FIGS. 3 and 4, the reflectivity for the beam entering from the left is greater than the reflectivity of the beam entering from the right. Hence, the feedback due to reflectivity is greater to the left, or clockwise, propagating beam, causing the device to lase predominantly in the clockwise direction.

In FIG. 3, a semiconductor triangular ring laser 50 is illustrated, the laser having three optical waveguide legs 52, 54 and 56 joined by totally reflecting mirrors, or facets, 58 and 60 and an output mirror, or facet, 62. The laser, in one embodiment, was formed from an AlGaAs/GaAs graded index, separate confinement heterostructure, single quantum well (GRINSCH-SQW) grown by molecular beam epitaxy (MBE), with the quantum well being $Al_{0.08}Ga_{0.94}As$, although any other laser materials can be used. The ring laser was fabricated using a self-aligned dry-etching process, with the facets being deep etched and the ridge waveguide being shallow etched to allow single-lateral-mode operation. The laser illustrated in FIG. 3 incorporates an optical diode structure generally indicated at 63 in waveguide leg 54, the diode 63 consisting of a tapering waveguide section 64 that widens very gradually in the counterclockwise direction of the ring laser, tapering outwardly from a first width at 66, which is the normal waveguide width, to a second width at 68. The widest section 68 is followed by an abrupt shoulder portion 70 that narrows the diode back to a width 72 which is the same as the original waveguide width at 66. The amount of asymmetric coupling seen by counter-propagating light beams in the laser cavity can be varied by adjusting the optical diode shape; for example, by adjusting the diode length, indicated by arrow 74, or by varying the diode width, indicated by arrow 76 in FIG. 3.

The illustrated structure provides preferential coupling into the clockwise propagation direction, indicated by arrow 80, because counterclockwise circulating laser light, indicated by arrow 82, arrives at the narrow end 66 of the outwardly tapering section 64 first. When this occurs, the lateral mode of light beam 82 slowly expands as the waveguide width increases, until the abrupt shoulder portion 70 is reached. The sudden narrowing of the waveguide diode causes some of the light from beam 82 to be reflected back in the clockwise direction to cross-couple with the clockwise beam 80. Since there is not a similar widening and sudden narrowing of the waveguide for light propagating in the clockwise direction, the clockwise beam 80 experiences less reflection at the abrupt step and thus receives more cross-coupling than does the counterclockwise beam 82, thereby reinforcing beam 80 compared to beam 82. Accordingly, this structure acts like an optical diode favoring the circulating direction toward which the diode is pointing; i.e., the clockwise direction, because clockwise beam 80 receives more reflected power and is attenuated less than counterclockwise beam 82.

FIG. 4 illustrates the optical diode 63 of FIG. 3 in perspective view, illustrating the epitaxial layer 84 on which the ridge waveguide is formed and showing the constant height and varying width of the waveguide. A maximum asymmetry of 20 to 1 in peak intensity with 5 to 10 being more typical, has been measured from lasers with this structure.

A second geometry for obtaining unidirectional lasing in a ring cavity is a simple tapered waveguide extending continuously along one leg of a ring cavity, in the manner illustrated for ring laser 90 in FIG. 5. As there illustrated, the laser 90 is triangular, including waveguide legs 92, 94 and 96, joined by facets, or mirrors 98, 100 and 102. The bottom leg 94 tapers continuously outwardly from region 104 adjacent facet 100 to region 106 adjacent facet 98 so that the waveguide is larger at facet 98 than at facet 100. The other waveguide sections are left unaltered. This geometry produces an asymmetric coupler along the tapered section due to the differences in the waveguide sections attached to each of the dielectric mirrors 98 and 100, and favors the clockwise direction of laser light propagation (beam 108) because the counter-clockwise circulating light (beam 110) suffers from a larger loss at the turning mirror 98 than does the clockwise light at that mirror. The clockwise beam 108 is completely intercepted by mirror 98, but when the counter-clockwise circulating light 110 arrives at the mirror 98, it has a widened mode, as discussed above. As a result, some of the light in beam 110 misses the turning mirror 98 and propagates out of the cavity, resulting in larger losses in this direction than in the counterclockwise direction. Thus, the mirror 98 will intercept and reflect more of the clockwise mode of beam 108 due to the tighter confinement of the waveguide, whereas the wider mode shape incident from the counter-clockwise direction of beam 110 will not interact as completely with the mirror 98 and will have a smaller reflection. These asymmetric forward coupling effects produce a highly asymmetric ring laser, with a maximum peak intensity ratio of over 30 having been observed.

Figure 6:
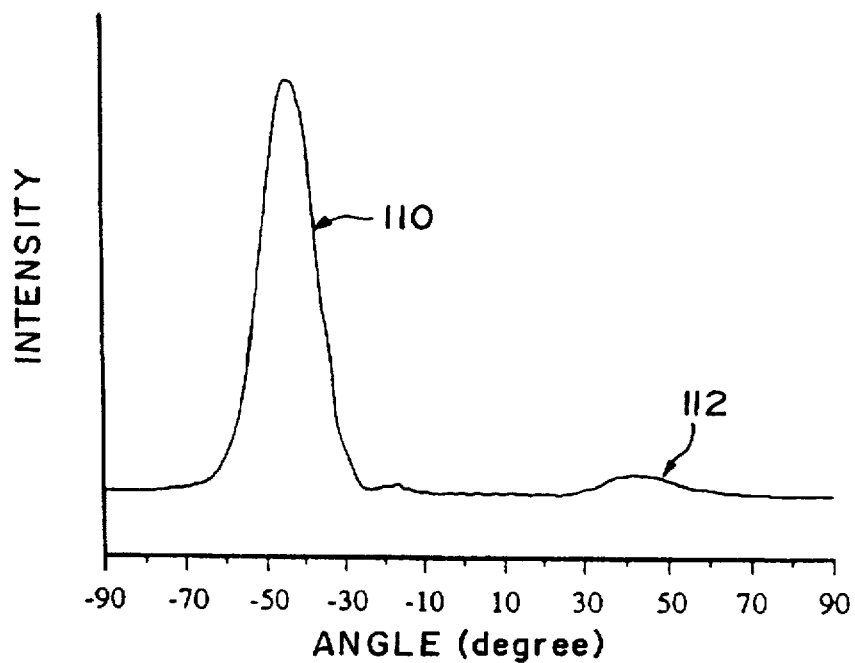
FIG. 6 is a graphical illustration of the lateral far field of the ring laser incorporating an optical diode, as illustrated in FIG. 3.

FIG. 6 is a graph illustrating the lateral far field of a ring laser with an optical diode of the type illustrated in FIG. 3, operated at twice its threshold current. The ring cavity length was 800 micrometers, the structure angle (the incidence angle at the output facet) was 12°, and the waveguide ridge width was 4 micrometers. As expected, the intensity of the output beam from the clockwise circulating direction, which is illustrated at 110, was the dominant beam, the output beam from the counterclockwise circulating direction being indicated at 112. The peak intensity ratio between the clockwise beam 110 and the counterclockwise beam 112 was 20:1.

Figure 7:
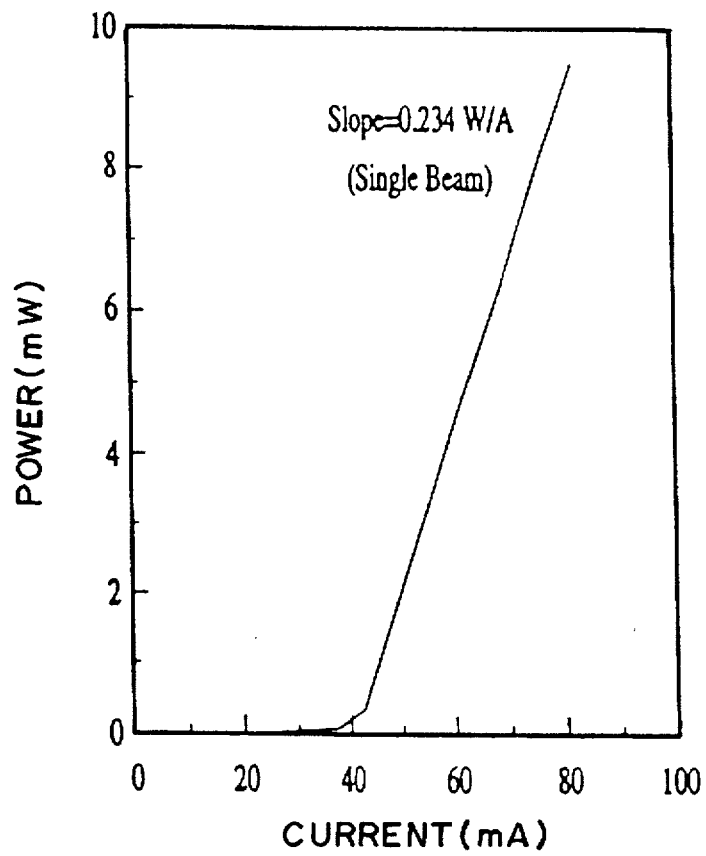
FIG. 7 is a graphical illustration of the single-beam light-current characteristics of the ring laser of FIG. 3 with an optical diode.

As illustrated in FIG. 7, the pulsed light-current characteristics of the ring laser of FIG. 3 for the dominant clockwise beam produces a single-beam slope efficiency of 0.23 W/A. The two-beam slope efficiency for a standard bidirectional ring laser with the same cavity length, ridge width and structure angle was found to be 0.26 W/A. The closeness of the single-beam slope efficiency to the two-beam slope efficiency indicates that the majority of the power for the ring laser with the optical diode was concentrated in one circulating direction only, rather than being lost by scattering out of the cavity, confirming its unidirectional operation. The single beam output power of 0.23 W/A is also substantially larger than the single beam output power of 0.26/2 W/A of the bidirectional ring, thereby illustrating the higher single beam power efficiency of a unidirectional ring.

Figure 8:
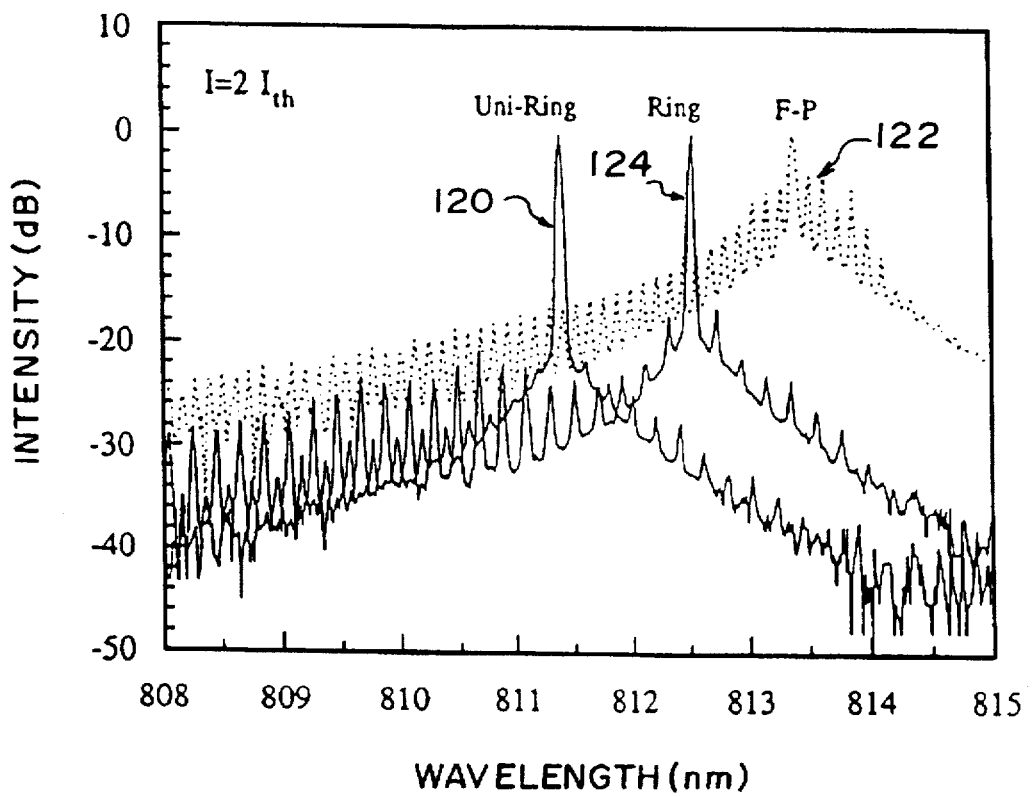
FIG. 8 is a continuous wave log-spectra of a unidirectional ring laser with an optical diode, a standard ring laser, and a Fabry-Perot laser, with each laser biased to twice its threshold current.

FIG. 8 illustrates at curve 120 the continuous wave log-spectrum for the unidirectional ring laser of FIG. 3, while curve 122 is the continuous wave log-spectrum for a rectangular laser with a cavity length of 700 micrometers and curve 124 is the continuous wave log-spectrum for a standard bidirectional ring with a cavity length of 800 micrometers and a structure angle of 12°. All three lasers were biased to twice their threshold current. The SMSR for the rectangular laser was about 4 dB, while that of the bidirectional ring was improved to about 17 dB and that of the unidirectional ring was further improved to about 22 dB, thereby showing the enhanced mode purity of the unidirectional ring laser.

Figure 9:
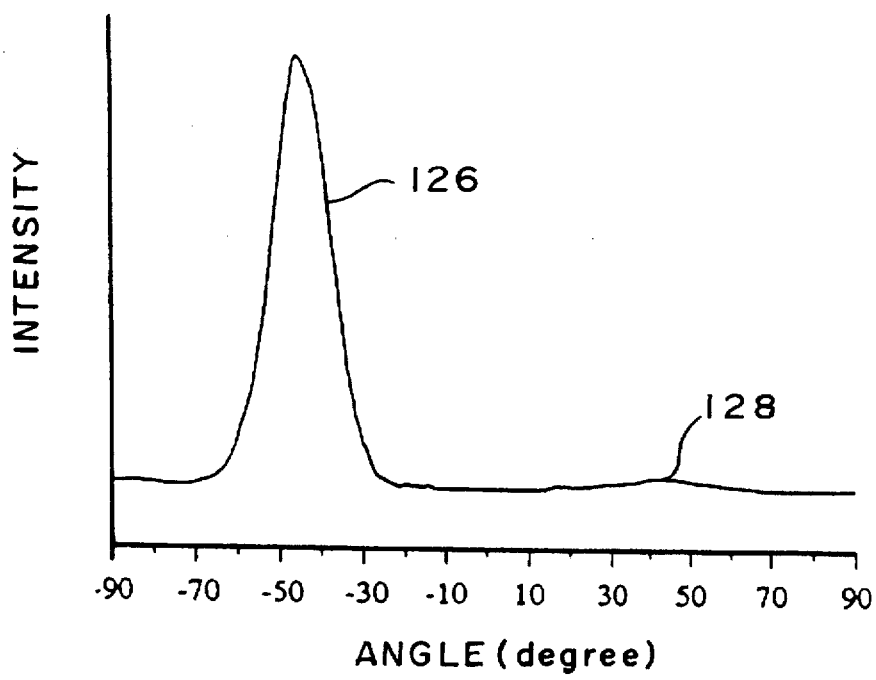
FIG. 9 is a graphical illustration of the lateral far field of a ring laser having a tapered waveguide mirror combination as illustrated in FIG. 5.

FIG. 9 is a graphical illustration of the lateral far field of a ring laser with a tapered waveguide as shown in FIG. 5, operated at twice its threshold current. The ring cavity length was 600 micrometers and the structure angle was 12°. The clockwise beam 126 was found to be the dominant one, as expected, with a peak intensity ratio between it and the counterclockwise output beam 128 being 33:1.

In summary, an essentially unidirectional ring laser is fabricated, in accordance with the invention, without the use of optical isolators. The invention utilizes an asymmetric coupler, based on the concept of a geometrically asymmetric refractive index profile, which induces a deliberate and deterministic difference in the back reflection and/or forward coupling of the two directions of optical propagation, resulting in an asymmetric power output which can be controlled so that all of the power is essentially in one direction. The asymmetric coupler can be passive or it can be dynamically controlled to select the direction of lasing. The elimination of the need for optical isolators to achieve unidirectional operation of ring lasers, in addition to the introduction of mass producible, low cost integrated lasers, is believed to greatly expand the potential for the use of ring lasers in many applications.

Although the present invention has been illustrated in terms of preferred embodiments, it will be understood that variations and modifications may be made without departing from the true spirit and scope thereof as set out in the following claims.

What is claimed is:

1. A method for producing unidirectional propagation of laser light in a ring laser, comprising:
    propagating first and second laser light beams in opposite directions within a ring laser cavity;
    asymmetrically coupling said beams within the laser cavity to reinforce one of the beams with respect to the other of the beams to produce essentially unidirectional light.

2. The method of claim 1, wherein asymmetrically coupling said beams includes producing stronger back reflections of one of said beams within said cavity with respect to the other of said beams.

3. The method of claim 2, wherein producing back reflections includes shaping said laser cavity to produce predetermined asymmetric back reflections.

4. The method of claim 2, wherein producing back reflections includes dynamically adjusting reflection coefficients within said cavity to control the direction of propagation of said unidirectional light.

5. The method of claim 4, wherein adjusting reflection coefficients includes varying the refractive indices of a part of said cavity.

6. The method of claim 4, wherein adjusting reflection coefficients includes changing the gain or loss of a part of said cavity.

7. The method of claim 2, wherein producing back reflections includes incorporating in said cavity a structure having a reflectivity for light propagating in one direction in said cavity which is different than its reflectivity for light propagating in an opposite direction in said cavity.

8. The method of claim 1, wherein producing asymmetric coupling includes producing asymmetric forward coupling of said beams.

9. A unidirectional ring laser comprising:
    a plurality of laser waveguides interconnected to produce a ring cavity and to propagate laser light in first and second opposite directions within said cavity; and
    an asymmetric coupler in one of said waveguides for cross-coupling light travelling in said first and second directions to produce essentially unidirectional light.

10. The unidirectional ring laser of claim 9, wherein said asymmetric coupler is controllable to change the direction of said unidirectional light.

11. The unidirectional ring laser of claim 10, wherein said asymmetric coupler is controllable by adjusting the refractive index of said coupler.

12. The unidirectional ring laser of claim 10, wherein said asymmetric coupler is controllable by adjusting the absorption coefficient of said reflector.

13. The unidirectional ring laser of claim 9, wherein said asymmetric coupler is a dielectric stack.

14. The unidirectional ring laser of claim 9, wherein said asymmetric coupler is an optical diode.

15. The unidirectional ring laser of claim 9, wherein said asymmetric coupler is a continuously tapered waveguide coupled to a mirror.

16. The method of claim 1, wherein asymmetrically coupling said beams includes producing a spatially asymmetric refractive index profile within said cavity; and
    interacting said beams with said profile to produce said essentially unidirectional light.

17. The method of claim 16, wherein said interacting includes reflecting said beams asymmetrically.

18. The method of claim 16, wherein said interacting includes transmitting said beams asymmetrically.

19. The method of claim 16, wherein said interacting includes asymmetrically scattering at least a part of each said beam.

20. The method of claim 16, further including controlling the direction of said unidirectional light.

21. The method of claim 20, wherein controlling the direction of said unidirectional light includes adjusting said refractive index profile.

22. The method of claim 21, wherein adjusting said refractive index profile includes changing the absorption coefficient of an active refractive index material in said cavity.

23. The method of claim 21, wherein adjusting said refractive index profile includes changing the refractive index of an electro-optic material in said cavity.

24. The method of claim 21, wherein adjusting said refractive index profile includes applying a variable electric field across selected layers of an asymmetric dielectric stack.

25. The method of claim 8, wherein said asymmetric forward coupling includes producing a spatially asymmetric refractive index profile within said cavity; and
    interacting said beams with said profile to produce said essentially unidirectional light.

26. The method of claim 25, wherein producing said spatially asymmetric refractive index profile includes geometrically shaping said cavity.

27. The method of claim 1, wherein asymmetrically coupling said beams includes both asymmetric forward coupling and asymmetric backward coupling of said beams.

28. A method for providing substantially unidirectional propagation of laser light in a ring laser, comprising:
    connecting plural optical waveguide sections to form a ring laser cavity;
    producing in at least one of said waveguide sections an active asymmetric reflector having a variable refractive index;
    introducing into said cavity counterpropagating laser light beams which interact with said reflector; and
    controlling the refractive index of said reflector to produce variable asymmetric coupling of said counterpropagating beams to provide substantially unidirectional light in a selected direction in said cavity.

29. The unidirectional ring laser of claim 9, wherein said coupler includes an asymmetric reflector in one of said waveguides.

30. The unidirectional ring laser of claim 29, wherein said reflector consists of a multilayer dielectric stack, and wherein at least one layer of said stack has a complex impedance.

31. The unidirectional ring laser of claim 30, further including means for applying a controllable electric field across selected layers of said stack to dynamically change the direction of said unidirectional light.

32. The unidirectional ring laser of claim 30, wherein said reflector incudes at least one layer of a dynamically variable electro-optic material.

33. The unidirectional ring laser of claim 30, further including means for changing a refractive index of at least one of said layers.

34. The unidirectional ring laser of claim 29, further including means for varying said reflector to selectively change the direction of said unidirectional light.

35. The unidirectional ring laser of claim 9, wherein said coupler comprises a geometrical asymmetry in the propagation path of said laser light in said cavity.

36. The unidirectional ring laser of claim 35, wherein said geometrical asymmetry is an optical diode.

37. The unidirectional ring laser of claim 35, wherein said geometrical asymmetry comprises a tapered waveguide.

38. The unidirectional ring laser of claim 9, including at least three waveguide legs joined by mirrors, one of said waveguides being tapered from a small end at a first mirror to a large end at a second mirror to produce asymmetrical reflections at said first and second mirrors of light travelling in said first and second directions.

* * * * *